United States Patent
Rokunohe et al.

(10) Patent No.: US 6,424,162 B1
(45) Date of Patent: *Jul. 23, 2002

(54) INSULATED DEVICE DIAGNOSING SYSTEM THAT PREPARES DETECTION DATA FROM PARTIAL DISCHARGE SIGNAL SUCH THAT PERIODIC ELEMENTS ARE GIVEN TO DIFFERENT SPECIFIC FREQUENCIES OF THE PARTIAL DISCHARGE SIGNAL

(75) Inventors: Toshiaki Rokunohe; Fumihiro Endo; Tokio Yamagiwa; Ryouichi Shinohara, all of Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/372,139

(22) Filed: Aug. 11, 1999

Related U.S. Application Data (63) Continuation of application No. 08/986,618, filed on Dec. 8, 1997, now Pat. No. 5,982,181.

(30) Foreign Application Priority Data

Dec. 9, 1996 (JP) .............................................. 8-328192

(51) Int. Cl.$^7$ ........................ H01H 31/12; G01R 31/08; G08B 21/00
(52) U.S. Cl. ..................... 324/551; 324/552; 324/536; 324/520; 340/644
(58) Field of Search ................................ 324/551, 536, 324/522, 520; 702/58, 185, 59; 340/644; 73/659

(56) References Cited

U.S. PATENT DOCUMENTS

| | | | |
|---|---|---|---|
| 5,107,447 A | * 4/1992 | Ozawa et al. | 702/58 |
| 5,146,170 A | * 9/1992 | Ishikawa et al. | 324/536 |
| 5,200,737 A | * 4/1993 | Konishi et al. | 340/644 |
| 5,214,595 A | * 5/1993 | Ozawa et al. | 702/58 |
| 5,253,180 A | * 10/1993 | Yamagiwa et al. | 702/59 |
| 5,256,976 A | * 10/1993 | Ishikawa et al. | 324/522 |
| 5,305,235 A | * 4/1994 | Izui et al. | 702/185 |
| 5,396,180 A | * 3/1995 | Hampton et al. | 324/551 |
| 5,419,197 A | * 5/1995 | Ogi et al. | 73/659 |
| 5,602,709 A | * 2/1997 | Al-Dabbagh | 361/85 |

FOREIGN PATENT DOCUMENTS

| | | | |
|---|---|---|---|
| JP | 1-107174 | * | 4/1989 |
| JP | 7-260868 | * | 4/1989 |

* cited by examiner

Primary Examiner—N. Le
Assistant Examiner—Wasseem H. Hamdan
(74) Attorney, Agent, or Firm—Mattingly, Stanger & Malur, P.C.

(57) ABSTRACT

An insulated device diagnosing system is capable of judging the deterioration, lifetime, and defects of a device. The intensity at each voltage phase angle is measured at a plurality of specific frequencies, taking high voltage phase angles as the abscissas. The deterioration, lifetime, and the kind and extent of abnormality of the device are judged from the pattern and intensity of the spectral distribution, which is obtained by peak-holding the measured intensity for a defined time period. According to the present invention, partial discharge can be measured highly sensitively and precisely to diagnose the deterioration, lifetime and the extent of defect of the device. As a result, the insulation reliability of the device can be improved, and the part of the device that should be repaired/replaced can be grasped before disassembly of the device, thereby cutting the maintenance cost.

5 Claims, 14 Drawing Sheets

INSULATED DEVICE DIAGNOSING SYSTEM THAT PREPARES DETECTION DATA FROM PARTIAL DISCHARGE SIGNAL SUCH THAT PERIODIC ELEMENTS ARE GIVEN TO DIFFERENT SPECIFIC FREQUENCIES OF THE PARTIAL DISCHARGE SIGNAL

This is a continuation application of U.S. Ser. No. 08/986,618, filed Dec. 8, 1997, now U.S. Pat. No. 5,982,181.

BACKGROUND OF THE INVENTION

In recent years, substation facilities have had to be strengthened as the power facilities have been installed at remote places or as the supply of power to cities has increased. For these necessities, there have already been spread and serviced gas insulated devices such as so-called gas-insulated breakers or transformers in which a substation device such as a disconnector or breaker is housed in a closed container by using $SF_6$ gas, which is excellent in insulation and arc extinguishing ability to improve the environmental adaptation and to decrease the installation volume per kV·A. This gas-insulated device is advantageous in its compactness and of its elimination of the exposed charging unit of a grounded tank, but is defective in difficulty in diagnosis for the maintenance, attributed to high performance, the increase in the time period for the maintaining and repairing works, and the marked lowering of the insulation reliability when the inside becomes abnormal. Similar problems are caused in transformers using oil insulation or in cables using solid insulation by the increase in the size of the device or in the transmission distance.

In order to improve the insulation reliability of the insulated device in its entirety, therefore, a variety of efforts have been made conventionally for appropriate design/manufacture of the device. For one improvement in the capacity of the power supply, confirmation and monitoring of the reliability of the entire device are required and various studies and investigations have been made.

One cause of the lowering of the insulation reliability is the non-uniform electric field. Especially, $SF_6$ gas, used in the gas insulated device, exhibits an the especially excellent insulating characteristics in a non-uniform electric field, but the insulating characteristics drop extremely under the non-uniform electric field. The factors disturbing the field distribution in a gas insulating device can be defects such as flaws in the surface of high-voltage conductors or metal foreign matter having entered the inside during assembly or transportation. Other conceivable factors may be an imperfect contact of high-voltage conductors due to assembly mistakes or defects such as voids in the insulation spacer. If a non-uniform electric field is established in the gas insulating device by those defects, partial discharge may be caused during the operation, leading to a serious situation such as the breakdown of the entire circuit. This makes it necessary to detect partial discharge reliably before the entire circuit breakdown thereby to prevent such breakdown in advance. From this background, there have been examined methods for detecting partial discharge which may occur not only in a gas insulating device but also in any insulated device.

Of these, there is a method of detecting electromagnetic waves which are generated as a result of partial discharge, disclosed in Japanese Patent Laid-Open No. 107174/1989. By this method, there is provided a diagnosis system in which input signals containing many radio frequency band components, received by an antenna provided in an insulated device, are expanded in intensity for every frequency by a spectral analyzer, so that only the presence/absence of partial discharge is detected based on the distribution pattern and level. Another diagnosis system is disclosed in Japanese Patent Laid-Open No. 260868/1995, in which the presence/absence of partial discharge and the type of defect are judged from the distribution and intensity of such a spectrum such that period parameters such as the voltage phase angle are given to the intensity of a fixed frequency in the intensity spectrum expanded by the spectral analyzer.

SUMMARY OF THE INVENTION

An object of the present invention is to provide an insulated device diagnosing system and a partial discharge detecting method, which can detect partial discharge accurately even for a different structure and circuitry of a device, and for different place where partial discharge occurs.

In order to achieve the above-specified object, according to the present invention, there is provided an insulated device diagnosing system comprising: an antenna provided in an insulated device; a pattern generator for receiving a partial discharge signal from the antenna and preparing detection data such that periodic elements are given to a plurality of specific frequencies; a neuro computer or a finger printing method operation unit for operating the detection data prepared by the pattern generator; and a judgment unit for diagnosing the extent of abnormality, the deterioration, or the lifetime of the device from the operation result of the operation unit. Moreover, the distribution of the frequency components of the detection signal is also measured for specifying the specific frequencies to be detected. The insulated device is a gas insulated breaker, and when the partial discharge signals coming from a plurality of antennas provided at different positions in the gas insulated breaker are individually measured synchronously, the partial discharge is located from the spectral pattern of the detection data between the same frequencies or from the intensity ratio.

According to the present invention, moreover, there is provided a partial discharge detecting method comprising the steps of: inputting a partial discharge signal from an input terminal; preparing detection data which are given periodic elements at a plurality of specific frequencies of the partial discharge signal; and diagnosing the extent of abnormality, deterioration or lifetime of the device from the pattern or intensity of the prepared detection data.

There is further provided a partial discharge detecting method comprising the steps of: inputting a partial discharge signal from an input terminal; determining the intensity in which the partial discharge signal is expanded for each frequency by an FFT or a spectral analyzer to select a plurality of specific frequencies having high intensities, detecting the intensity of each frequency of the partial discharge signal to select a plurality of specific frequencies of which the intensities exceed a predetermined value, or selecting the frequency having the highest intensity from the plural specific frequencies; preparing detection data, which are given periodic elements at a specific frequency selected; and processing at least one of the detection data or displaying the same on a screen to detect the partial discharge.

There is further provided a partial discharge detecting method comprising the steps of: inputting a partial discharge signal from an input terminal; preparing detection data such that a plurality of specific frequencies of a partial discharge signal are given periodic elements; preparing sampling data by differentiating either averaged data averaged from detection data of different frequencies or known data from the respective detection data, or by differentiating the intensities of the detection data which are detected by antennas provided in different positions, between identical frequencies; and diagnosing the extent of abnormality, the deterioration or the lifetime of the device from the pattern or intensities of the prepared sampling data.

Moreover, the extent or kind of abnormality, the deterioration or the lifetime of the device is diagnosed by processing the detection data by a neuro or a finger printing method.

DESCRIPTION OF THE PREFERRED EMBODIMENTS

Figure 1:
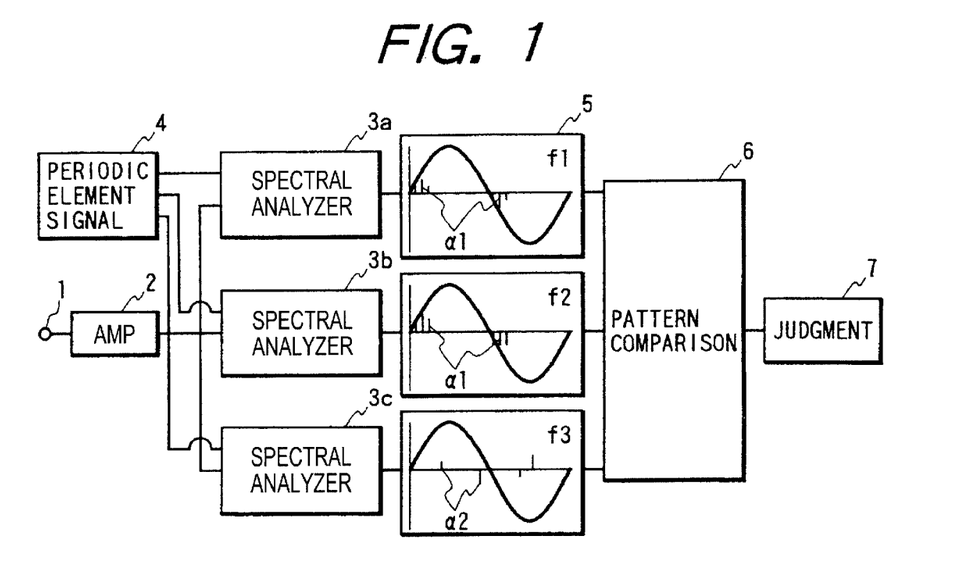
FIG. 1 is a diagram showing the construction of an insulated device diagnosing system of one embodiment of the present invention.

As shown in FIG. 1, an insulated device diagnosing system of the present embodiment is constructed to comprise: an antenna 1 for receiving electromagnetic waves generated from partial discharge, provided in an insulated device such as a gas-insulated device, a transformer or a cable; an amplifier 2 for receiving and amplifying the signal coming from the antenna 1; a synchronizing element signal generator 4 for generating a synchronizing element signal; a plurality of spectral analyzers,3a–3c for receiving the signal of the synchronizing element signal generator 4 and the signal amplified by the amplifier 2, to perform frequency analysis at specific frequencies; a pattern generator 5 for generating a pattern which is synchronized with time by the synchronizing element signal at the plural analyzed frequencies, i.e., a pattern which has an intensity distribution of a specific frequency with respect to a voltage phase angle; a pattern comparator 6 for comparing the patterns which are produced by the pattern generator 5; and a judgment unit 7 for making a judgment on the basis of the result of the pattern comparator 6. Here, the frequencies are fixed different frequencies determined by inputting signals such as pseudo pulses in advance to the device and by measuring them. The pattern generator 5 generates a pattern to which are added the synchronizing element and the spectral intensity by superposing the sinusoidal waveform as the synchronizing element and the specific analyzed frequencies.

With this construction, the detection data having time elements can be synchronously prepared during the operation, so that the signal of the partial discharge can be discriminated from noise by comparing the pattern of the detected data at each frequency with the fundamental data. Specifically, the frequency distribution and magnitude of the electromagnetic waves generated by partial discharge are changed by the circuitry of a power device or the location of the partial discharge. Since the electromagnetic waves are compared for the specific frequencies, however, the noise and the signal of the partial discharge can be discriminated from each other because correlation can be achieved with the patterns. Moreover, the lifetime up to dielectric breakdown can be estimated from the intensity of the detection data obtained.

Figure 2:
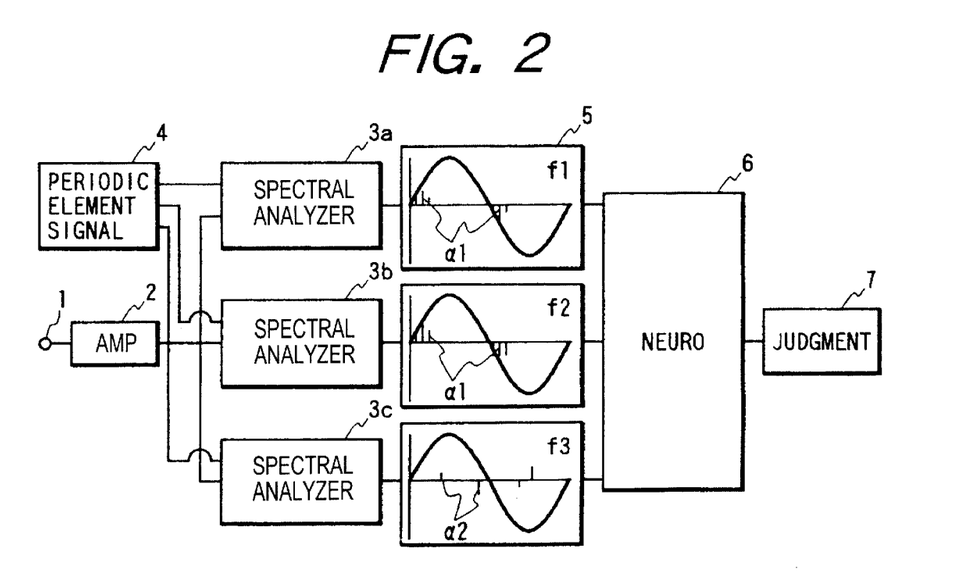
FIG. 2 is a diagram showing the construction of a modification of the insulated device diagnosing system shown in FIG. 1.

FIG. 2 is a diagram showing a construction of an insulated device diagnosing system of a modification of the embodiment shown in FIG. 1. In the modification, the portion for the pattern comparison is processed by a neuro computer 8. This neuro computer can make judgment about even an unknown pattern highly precisely and is suited for the diagnosis by giving it teacher data in advance.

Figure 3:
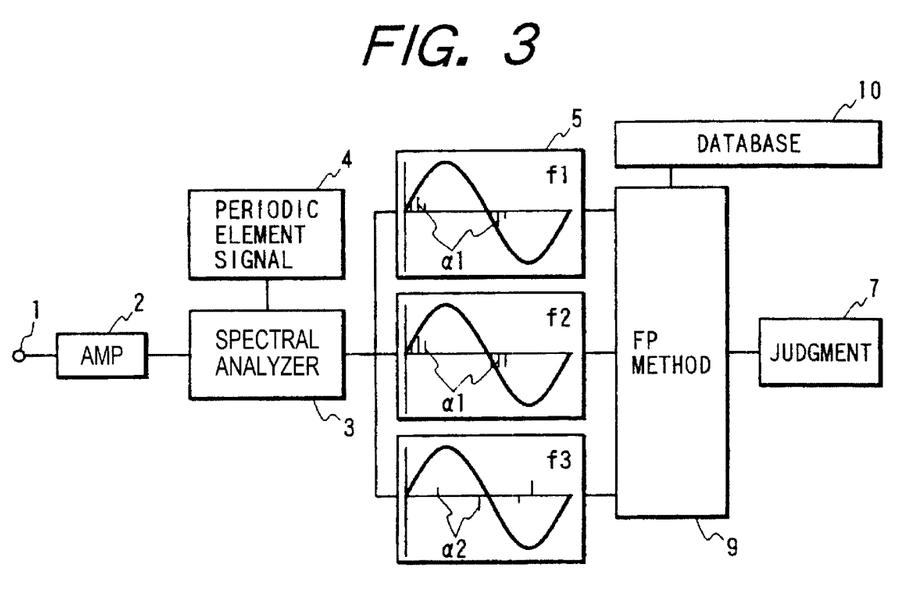
FIG. 3 is a diagram showing the construction of a modification of the insulated device diagnosing system shown in FIG. 1.
Figure 4:
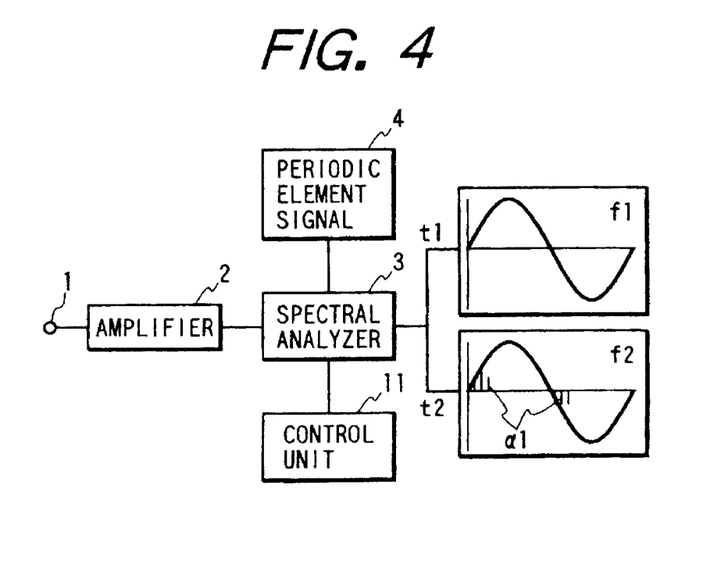
FIG. 4 is a diagram showing the construction of a modification of the insulated device diagnosing system shown in FIG. 1.

FIG. 3 is a diagram showing a construction of a modification of the insulated device diagnosing system of the embodiment shown in FIG. 1. In the modification of FIG. 3, the pattern comparison is performed by a finger printing method (hereinafter referred to also as the FP method). As shown in FIG. 3, the insulated device diagnosing system is equipped with a memory unit 10 for storing a database and an FP method operation unit 9 connected with the memory unit 10. In this example, moreover, one spectral analyzer 3 is used for one antenna 1, as shown in FIG. 4. In this method, the frequency analysis is made at a plurality of specific frequencies by varying the fixed frequency of the spectral analyzer at preset time intervals by the signal of the synchronizing element signal generator 4 and by a control unit 11. By this method, the measurement of a frequency f2 cannot be performed at the time of measuring a fixed frequency f1, so that there is an uncertain element in partial discharge varying with time. However, the method is advantageous in that the number of spectral analyzers can be reduced, thereby providing an economically advantageous aspect and making the measuring system compact.

As in this example, the FP method is free from the learning which is necessary for the neuro computer, so that the software can be easily developed. On the other hand, the FP method is inferior to the neuro computer in the judgment precision for an unknown pattern.

For the insulated device diagnosing system of the present embodiment thus constructed, not only the kind of defect in the device can be detected with a high sensitivity, but also the situation of the partial discharge can be grasped with a high precision, and hence the extent or kind of deterioration, lifetime or abnormality of the device can be diagnosed highly sensitively and precisely.

Figure 5:
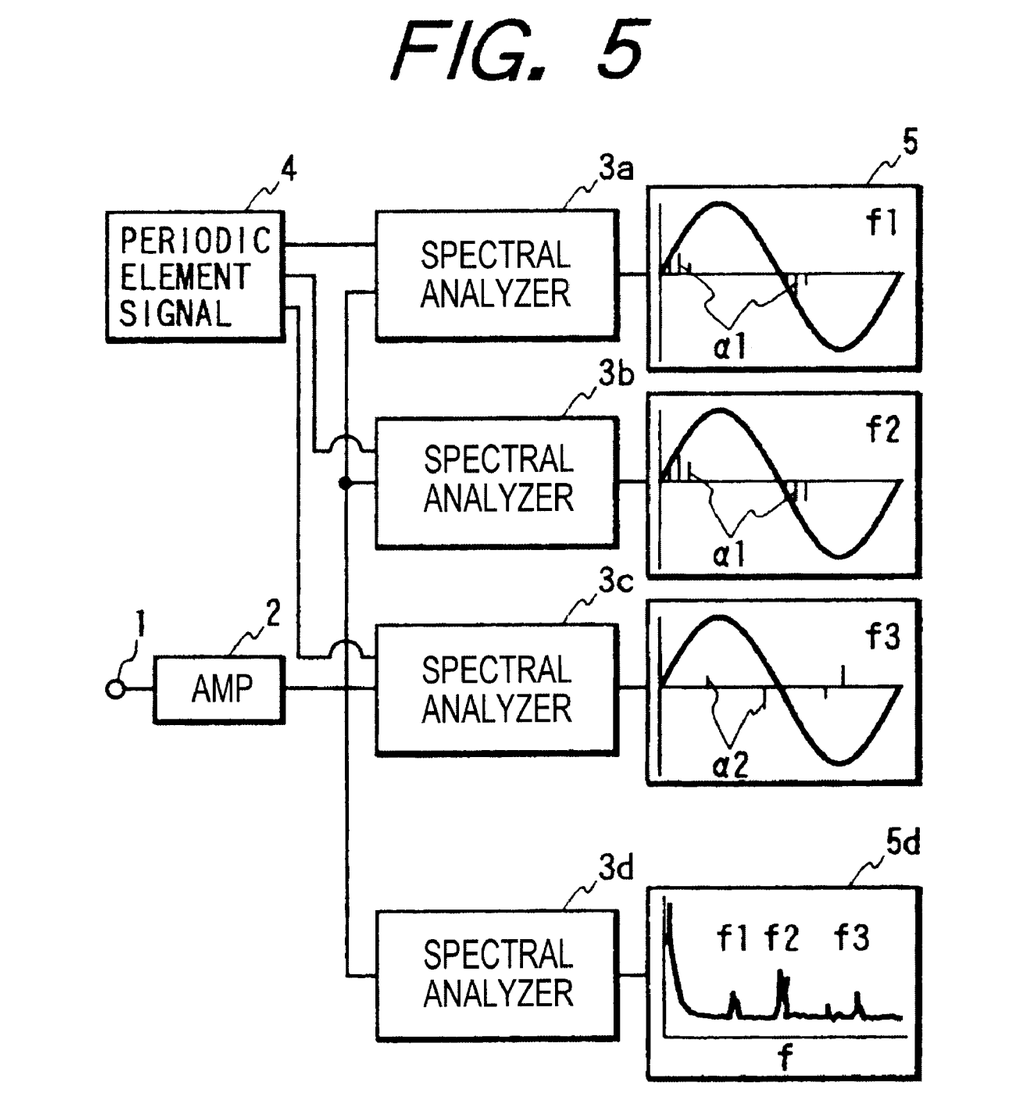
FIG. 5 is a diagram showing the construction of an insulated device diagnosing system of another embodiment of the present invention.

Another embodiment of the present invention will be described with reference to FIGS. 5, 6. FIG. 5 is a diagram showing the construction of an insulated device diagnosing system of the embodiment, and FIG. 6 is a diagram showing the construction of a modification of the insulated device diagnosing system.

In the present embodiment, as shown in FIG. 5, the intensity distributions at a plurality of predetermined frequencies with respect to the voltage phase angle and the spectral distributions for frequency distributions are combined to detect partial discharge. Specifically, the signal of the synchronizing element signal generator 4 is added not only to the spectral analyzers 3a–3c shown in FIG. 1 but also to a spectral analyzer 3d so that the spectral distribution can be synchronously measured by the spectral analyzer 3d. With this construction, not only the intensity distributions at the specific frequencies with respect to the voltage phase angle but also the spectral distributions can be simultaneously measured, imparting the advantages of the measuring methods.

Figure 6:
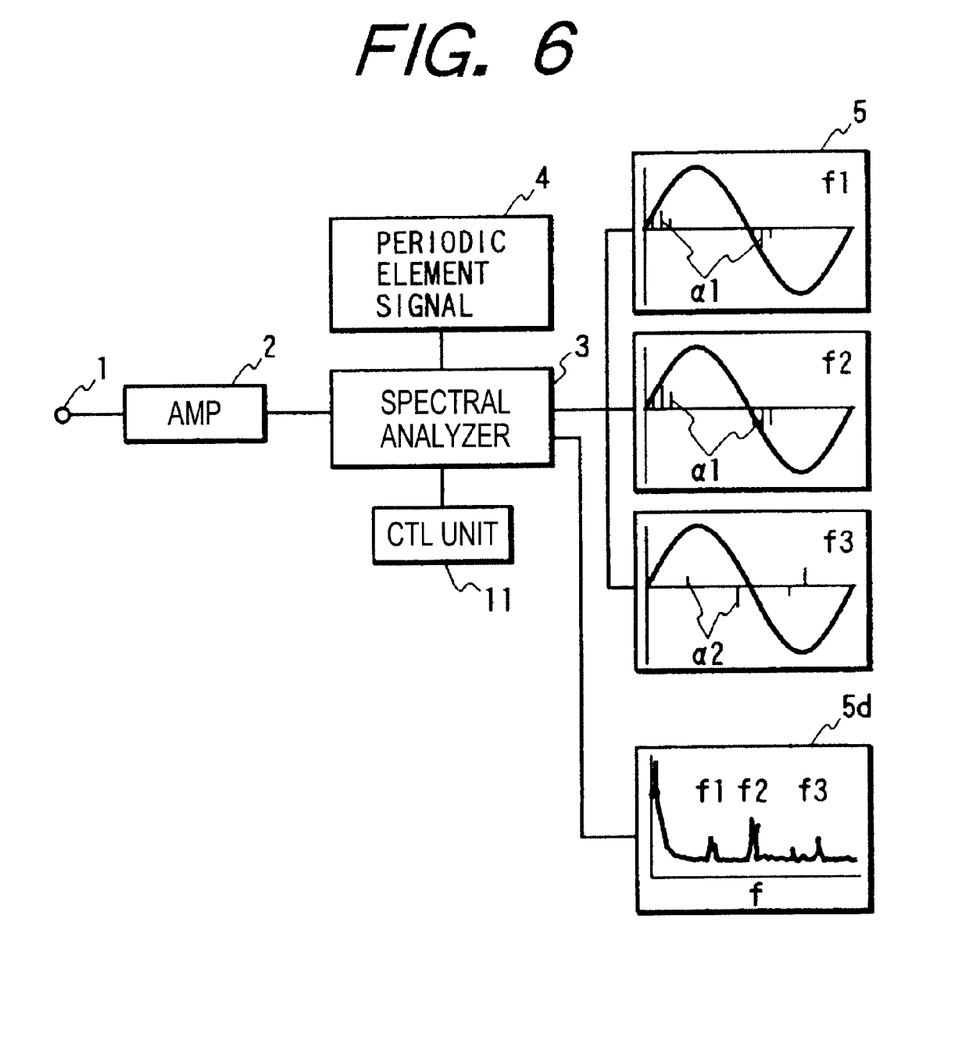
FIG. 6 is a diagram showing the construction of a modification of the insulated device diagnosing system shown in FIG. 5.

FIG. 6 shows a modification of FIG. 5, in which one spectral analyzer 3 is used for each antenna 1, as described with reference to FIG. 4, so that the frequency analysis may be performed by varying the fixed frequency of the spectral analyzer 3 and the spectral distribution at preset time intervals by the signal of the synchronizing element signal generator 4 and by the control unit 11. This modification also has effects similar to those of the description of FIG. 4.

Figure 7:
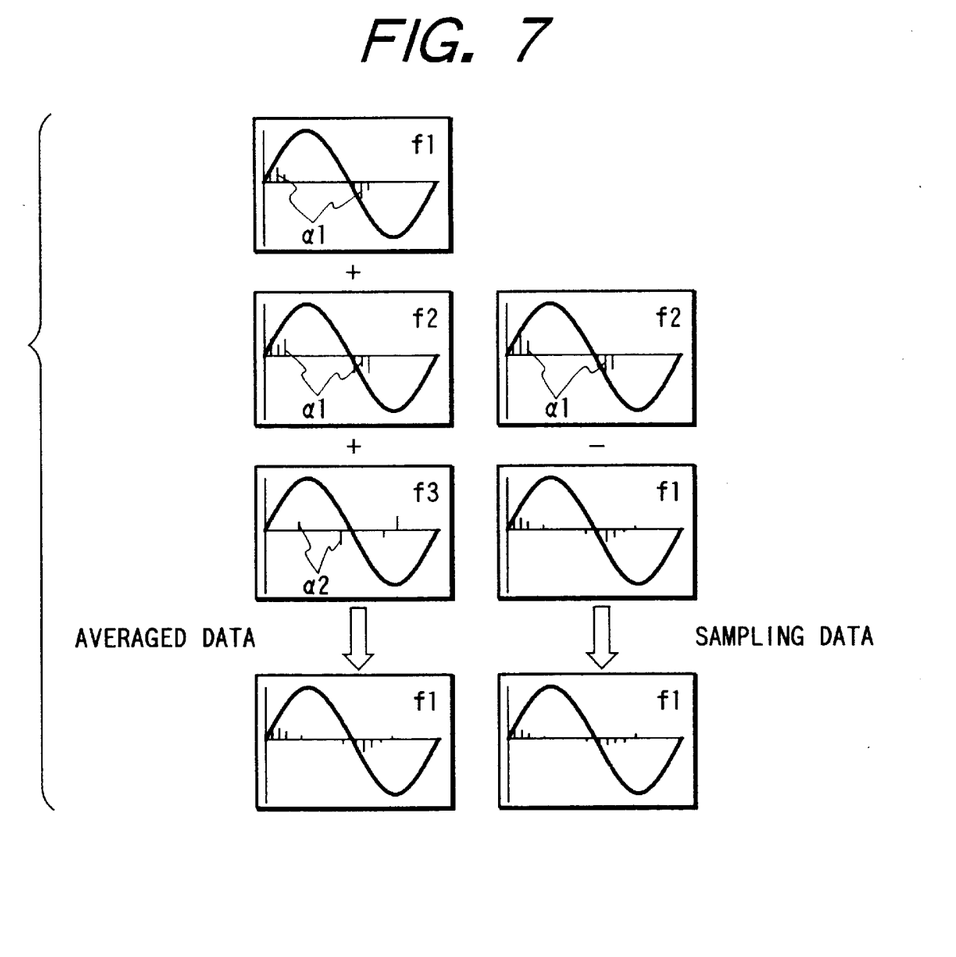
FIG. 7 is a diagram showing the construction of an insulated device diagnosing system of another embodiment of the present invention.

Another embodiment of the present invention will be described with reference to FIGS. 7 and 8. FIG. 7 is a diagram for illustrating a data preparing method, and FIG. 8 is a diagram showing a construction of an insulated device diagnosing system of the present embodiment.

In the present embodiment, as shown in FIG. 7, averaged data and sampling data are prepared from the detected data for different specific frequencies. As illustrated at the left-hand side of FIG. 7, more specifically, the averaged data are prepared by adding and averaging the data of frequencies f1, f2 and f3, and the sampling data are prepared by differentiating the averaged data from the data of the frequency f2, for example.

The averaged data are the averaged intensity distributions of the detected data with respect to different specific frequencies. When noise is present only at the frequency f3, for example, it is possible to prepare the data in which the noise is apparently decreased. Moreover, the intensity distribution of the signal is also averaged so that the matching with the fundamental data of partial discharge can be facilitated. If this matching with the pattern of the fundamental data is difficult, it may be improved depending upon the frequency by referring to the sampling data, so that the diagnosing precision of partial discharge can be improved.

Figure 8:
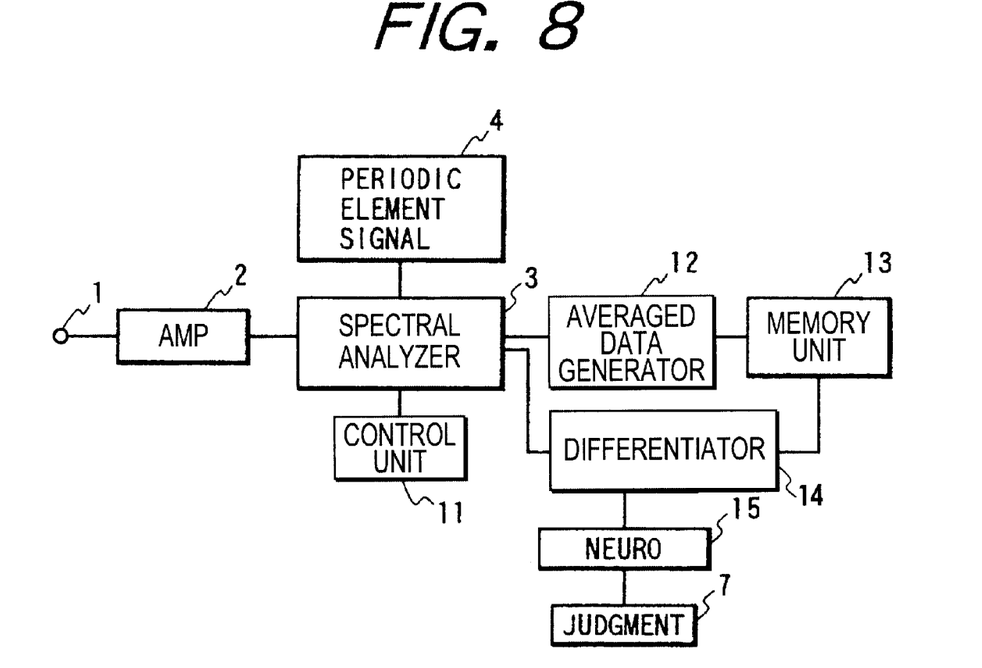
FIG. 8 is a diagram showing a construction of a modification of the insulated device diagnosing system shown in FIG. 7.

A specific example of the construction is shown in FIG. 8, in which the signal from the antenna 1 is inputted to and amplified by the amplifier 2 and is fed to the spectral analyzer 3. To this spectral analyzer 3, there are connected the synchronizing element signal generator 4 and the control unit 11. The output of the spectral analyzer 3 is connected to an averaged data generator 12 and a differentiator 14, which are connected to a memory unit 13. The differentiator 14 is connected to a pattern recognition unit 15 such as a neuro computer, which is further connected to the judgment unit 7.

In the insulated device diagnosing system thus constructed, the setting of the spectral analyzer 3 is varied at preset time intervals by the control unit 11, and the measured signal is inputted to the averaged data generator 12 to prepare the averaged data, so that the result is stored in the memory unit 13. Next, the averaged data are differentiated from the detection data obtained from spectral analyzer 3, to prepare the sampling data. The partial discharge is measured by inputting the averaged data and the sampling data to the pattern recognition unit 15 so that they may be processed.

Figure 9:
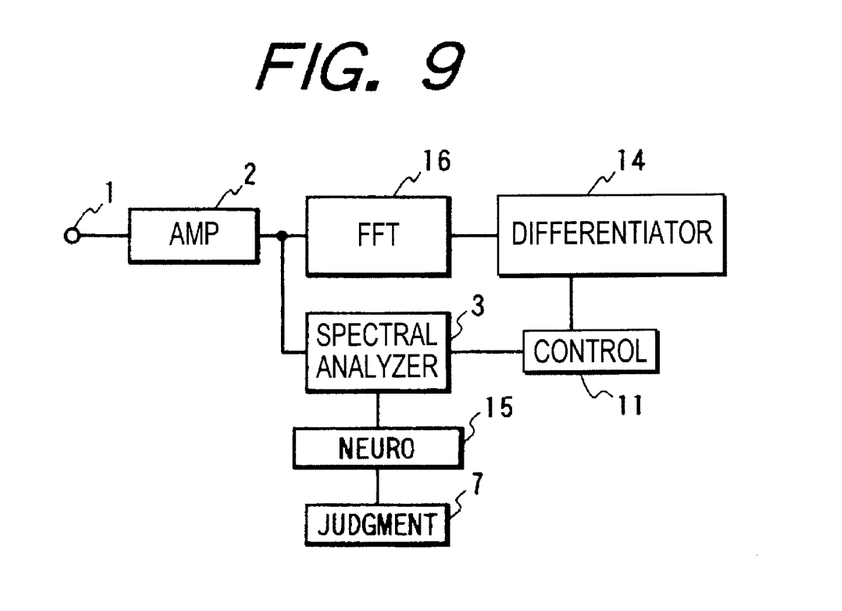
FIG. 9 is a diagram showing the construction of an insulated device diagnosing system of another embodiment of the present invention.

Another embodiment of the present invention will be described with reference to FIG. 9. FIG. 9 is a diagram showing the construction of the insulated device diagnosing system of the present embodiment.

The insulated device diagnosing system of the present embodiment is so constructed as to comprise: an amplifier 2 connected to an antenna 1; an FFT 16 connected in parallel with the amplifier 2; a differentiator 14 connected to the FFT 16 and to the spectral analyzer 3 through a control unit 11; a pattern recognition unit 15 of a neuro computer or the FP method connected to the spectral analyzer 3; and the judgment unit 7 connected to the pattern recognition unit 15. In the present embodiment, both the spectral analyzer 3 and the FFT 16 are employed, a plurality of frequencies having high spectral intensities are selected by an operation unit, and the detection data are prepared by varying the setting of the spectral analyzer 3 at preset time intervals. Thus, the range of the frequencies to be selected can be widened, and the frequency to be set can be optimized for the situation of the partial discharge; therefore the partial discharge can be detected highly sensitively and precisely.

Figure 10:
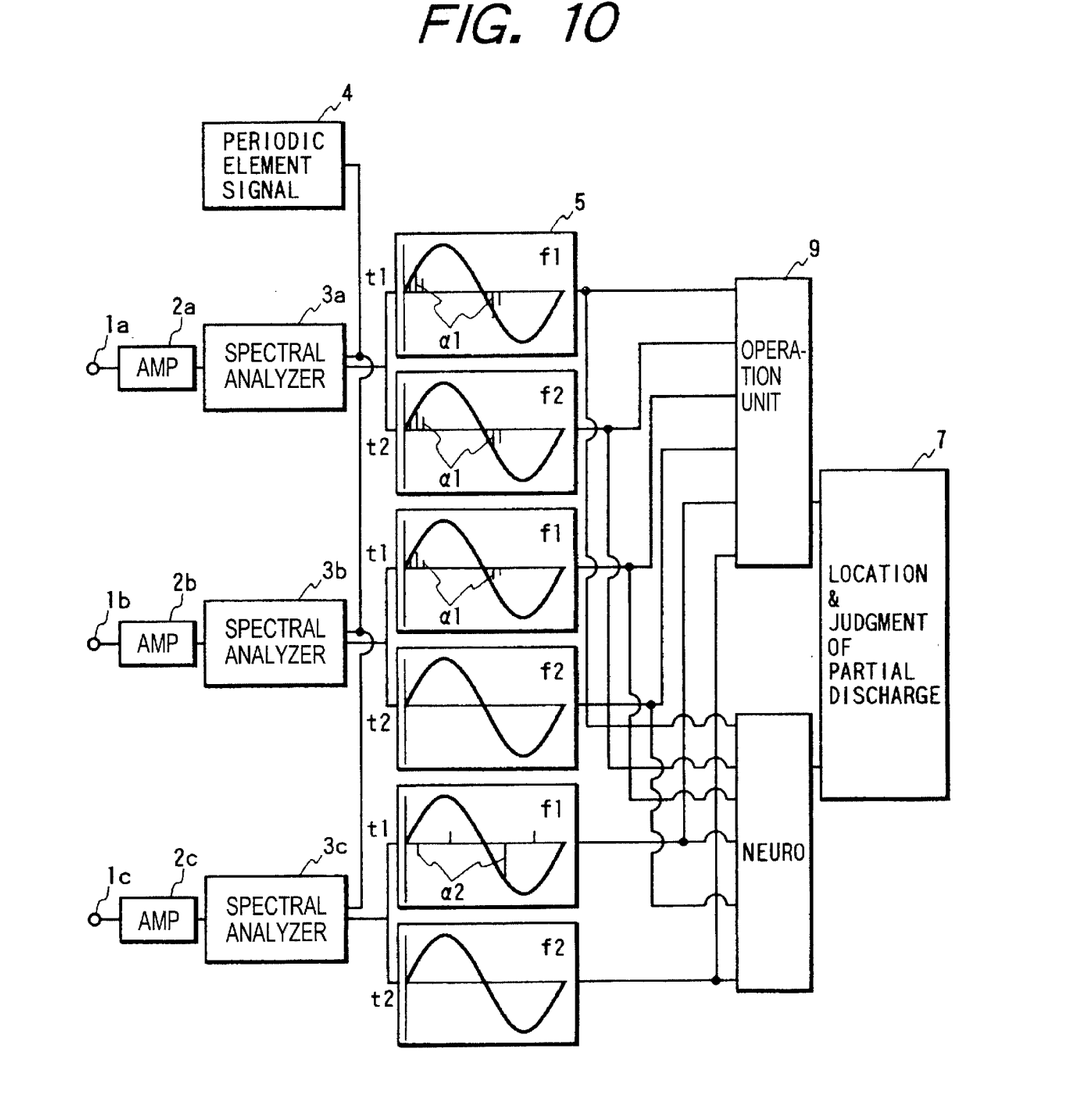
FIG. 10 is a diagram showing the construction of an insulated device diagnosing system of another embodiment of the present invention.
Figure 11:
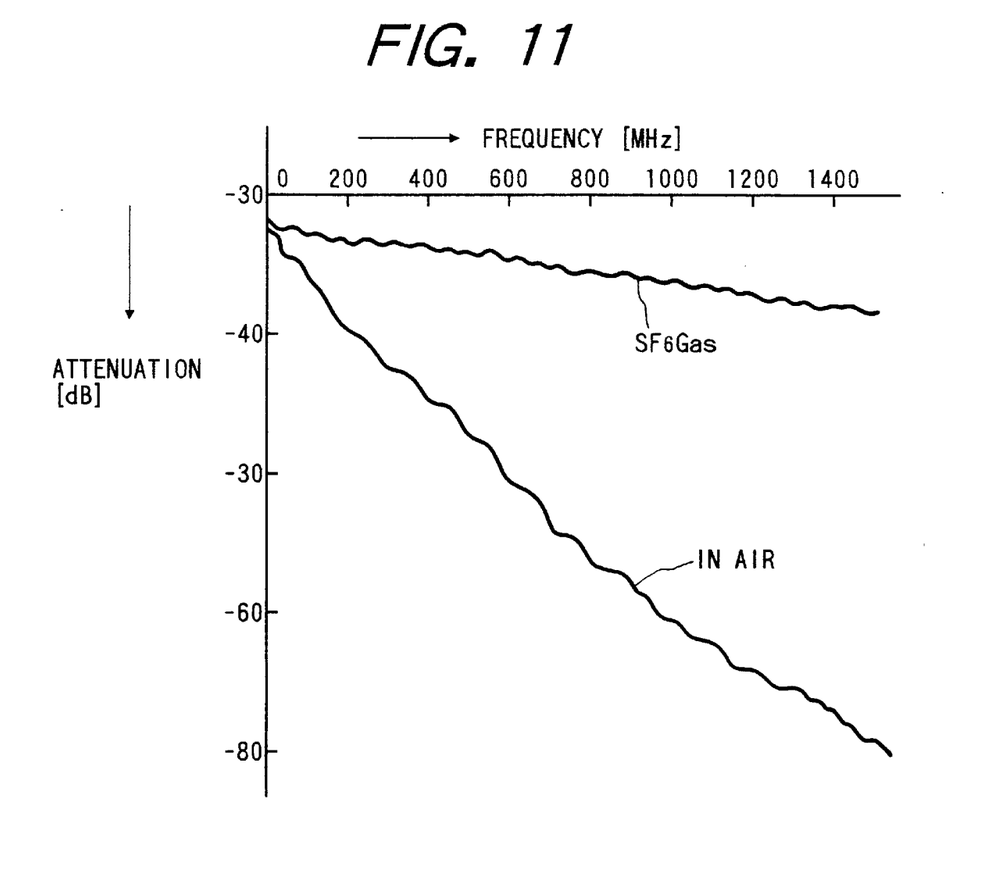
FIG. 11 is a diagram for explaining the principle of measurement.

Another embodiment of the present invention will be described with reference to FIGS. 10 to 12. FIG. 10 is a diagram showing the construction of the insulated device diagnosing system of the present embodiment; FIG. 11 is a diagram illustrating the principle of measurement; and FIG. 12 is a diagram showing the construction of an insulated device diagnosing system of a modification of FIG. 10.

In the insulated device diagnosing system of the present embodiment, as shown in FIG. 10, there are provided a plurality of antennas 1a–1c; to which spectral analyzers 3a–3c are respectively connected through amplifiers 2a–2c. Each spectral analyzer is connected to a synchronizing element signal generator 4, which is connected to a pattern generator 5 for preparing synchronized intensity distribution patterns of specific frequencies with respect to voltage phase angles. To this pattern generator 5, moreover, there is connected an operation unit 9 which in turn is connected to a judgment unit.

In the present embodiment, the antennas 1 are used to synchronize the measurements at the individual antennas 1 so that not only the parts to be insulation-diagnosed, but also the discharge parts can be located, as will be described with reference to FIG. 11. For example, the electromagnetic waves propagated in the $SF_6$ gas are different in attenuation depending on the frequency, as illustrated in FIG. 11, so that the partial discharge can be located by determining the ratios of the detection data of the same frequency, collected from the antennas. A more distant partial discharge can be located with a higher precision by using the detection data for frequencies.

Figure 12:
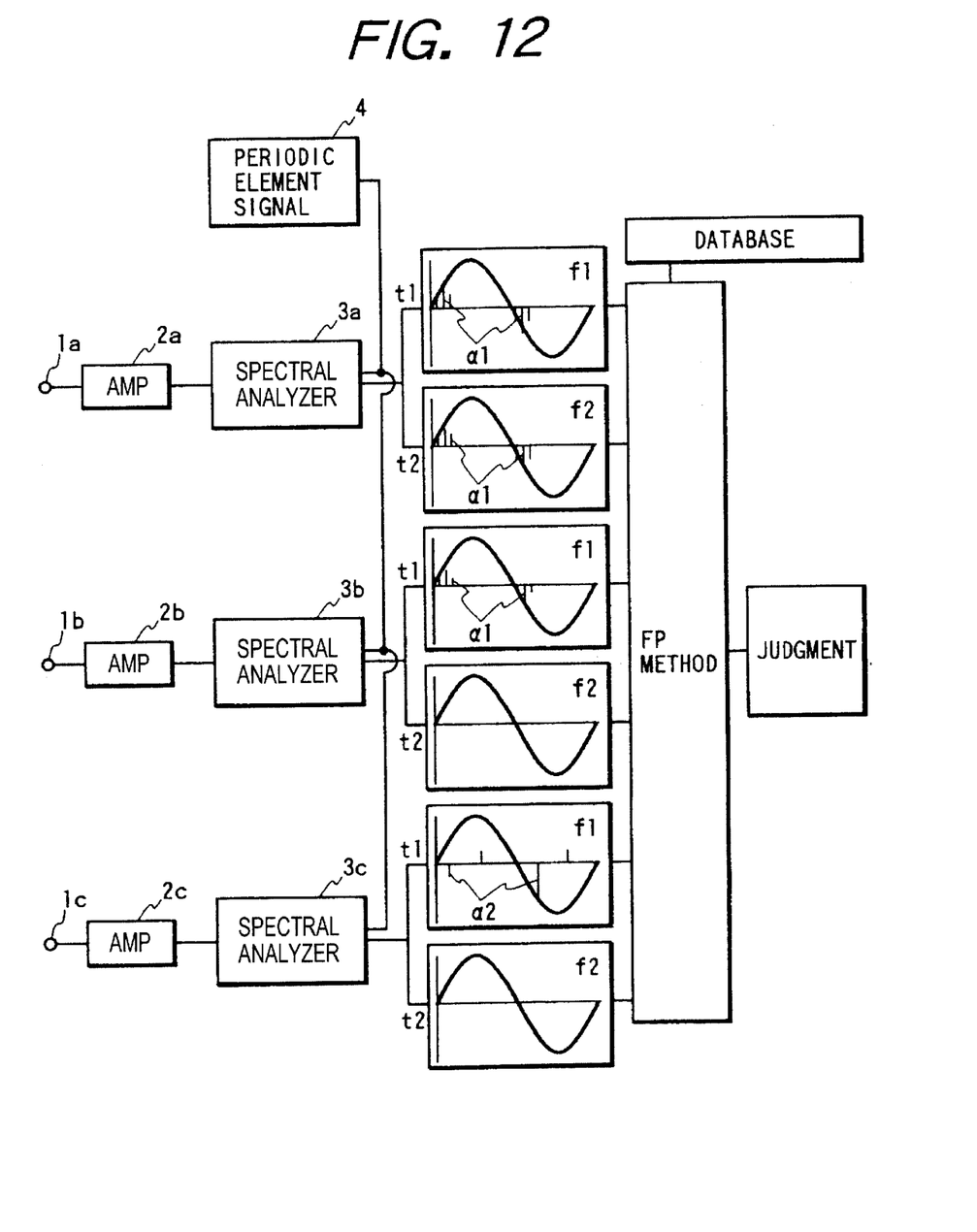
FIG. 12 is a diagram showing the construction of a modification of the insulated device diagnosing system shown in FIG. 10.

FIG. 12 shows a diagnosing system in which the FP method is employed but partial discharge is not located, unlike the embodiment shown in FIG. 10. Thus, the system can be simplified to hold down the cost of the system.

Figure 13:
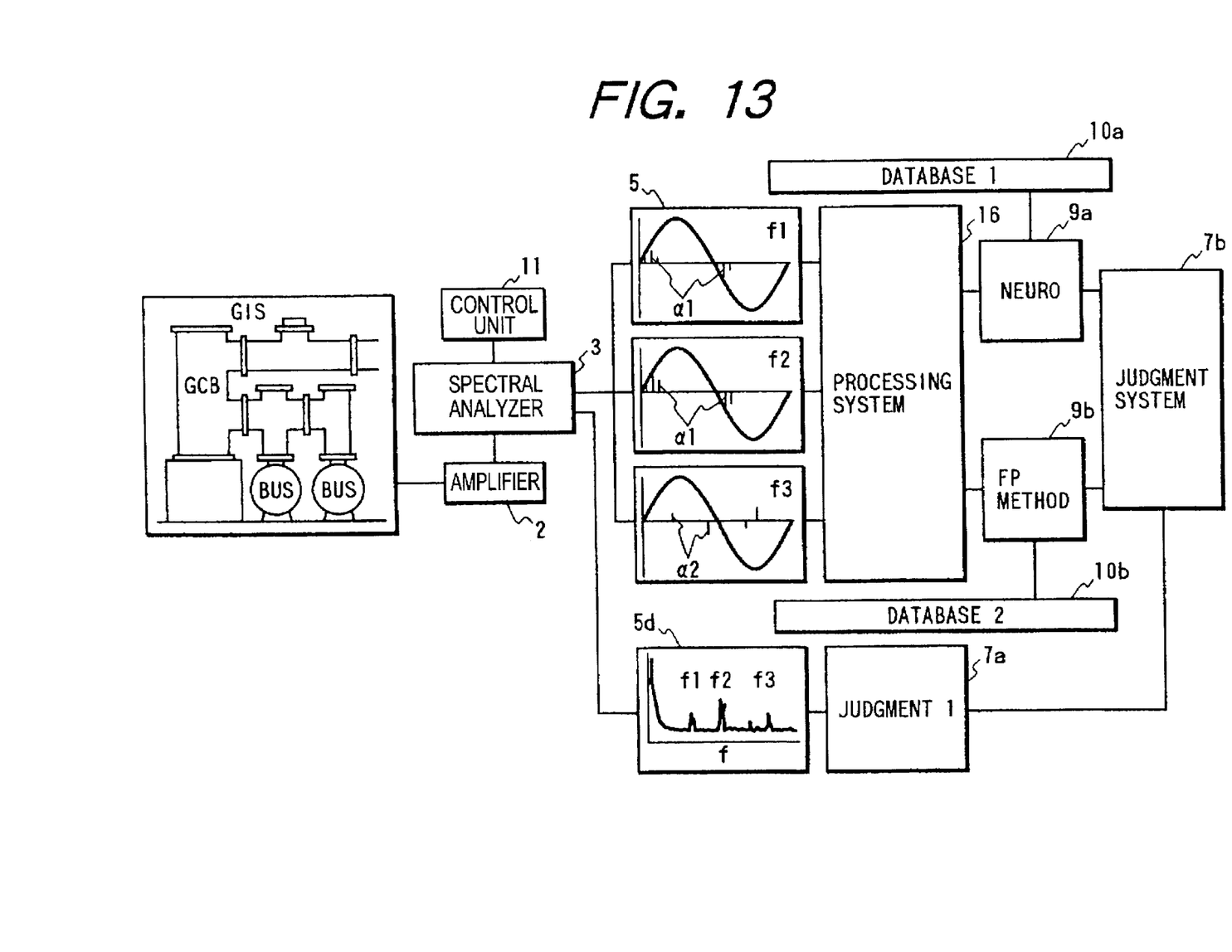
FIG. 13 is a diagram showing the construction of an insulated device diagnosing system of another embodiment of the present invention.

Another embodiment of the present invention will be described with reference to FIG. 13. FIG. 13 is a diagram showing the construction of an insulated device diagnosing system of the present embodiment, and shows an insulated device diagnosing system applied to a gas insulated breaker.

In the insulated device diagnosing system of the present embodiment, as shown in FIG. 13, an antenna 1 provided in a gas insulated breaker is connected through an amplifier 2 to a spectral analyzer 3, so that the frequency analysis is made by changing the fixed frequency of the spectral analyzer 3 and the spectral distribution at preset time intervals by a control unit 11 connected to the spectral analyzer 3. The pattern of the intensity distribution of specific frequencies with respect to the voltage phase angle is prepared by a pattern generator 5 and is processed by a processing system 16. After this, the processed pattern is inputted to a neuro computer 9a and an FP method operation unit 9b, which are respectively connected to memory units 10a and 10b that store databases. The spectral distribution made by a spectral distribution generator 5b is inputted to judgment unit 7a. All the outputs of the neuro computer 9a, the FP method operation unit 9b and the judgment unit 7a are inputted to a judgment unit 7b.

Thus, the present embodiment judges in combination both the result that the pattern of the intensity distribution of the specific frequency with respect to the voltage phase angle is operated by the neuro computer 9a and the FP method operation unit 9b and the result of the judgment from the frequency spectral distribution, so that an insulation diagnosis of higher precision can be made. As a result, the present embodiment is effective in major substations that especially require high reliability.

Figure 14:
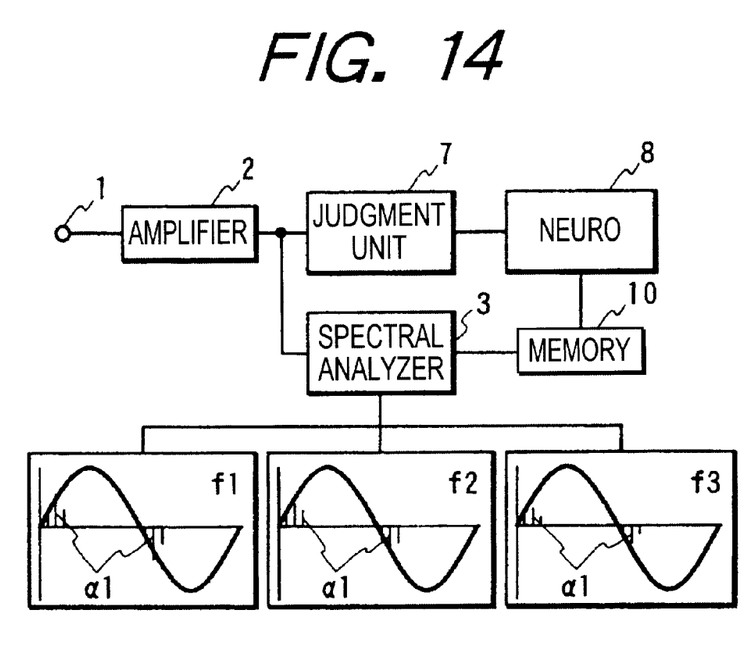
FIG. 14 is a diagram showing the construction of an insulated device diagnosing system of another embodiment of the present invention.
Figure 15:
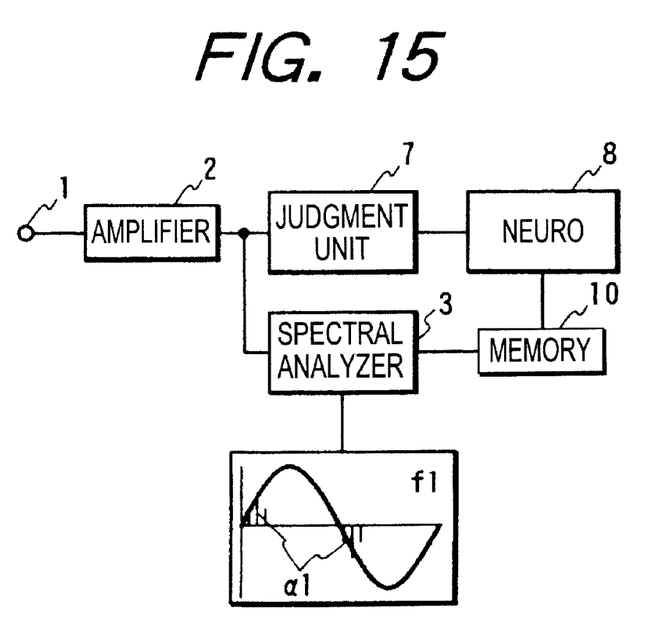
FIG. 15 is a diagram showing the construction of a modification of the insulated device diagnosing system shown in FIG. 14.

Another embodiment of the present invention will be described with reference to FIGS. 14 and 15. FIG. 14 is a diagram showing the construction of the insulated device diagnosing system of the present embodiment, and FIG. 15 shows a modification of the insulated device diagnosing system.

Figure 16:
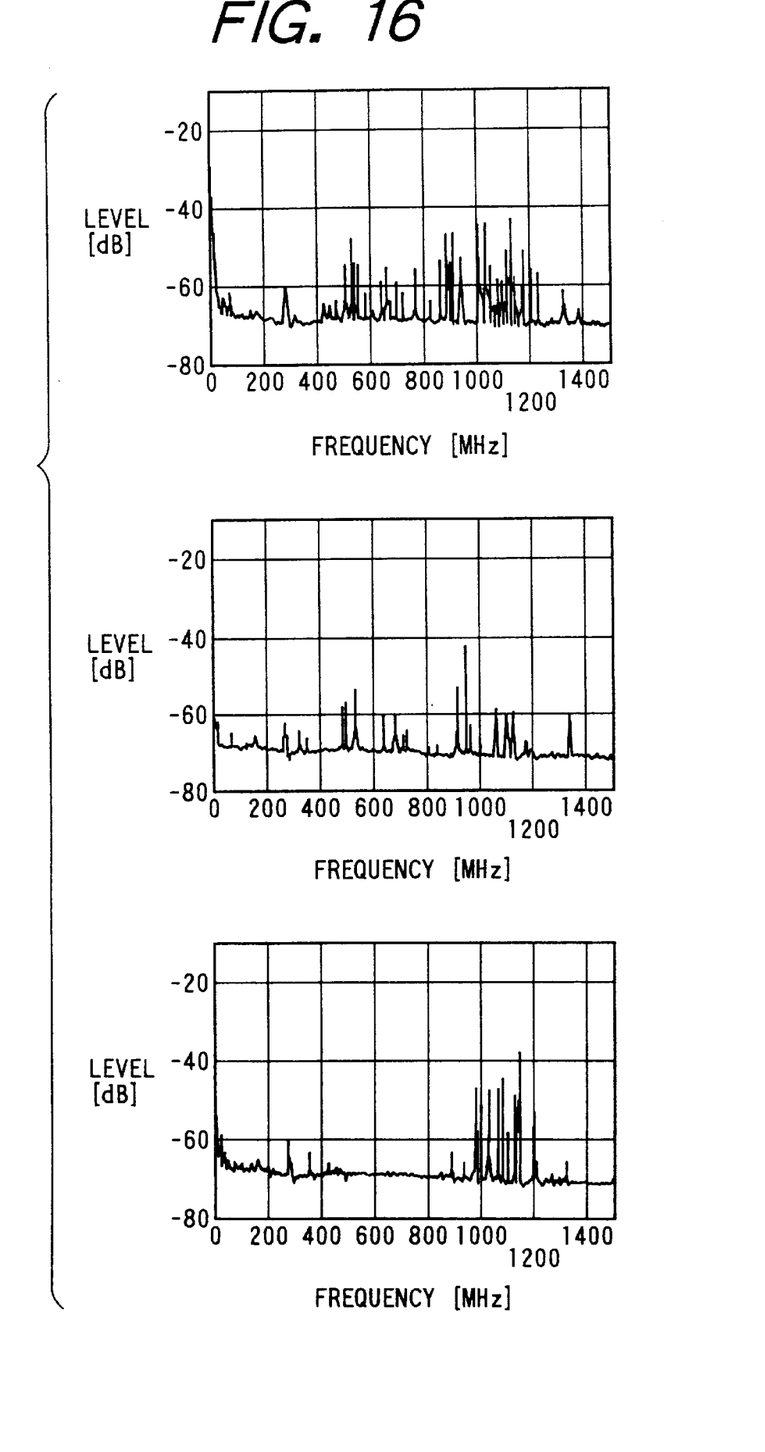
FIG. 16 is diagrams illustrating an example of partial discharge due to a conductive foreign matter.
Figure 17:
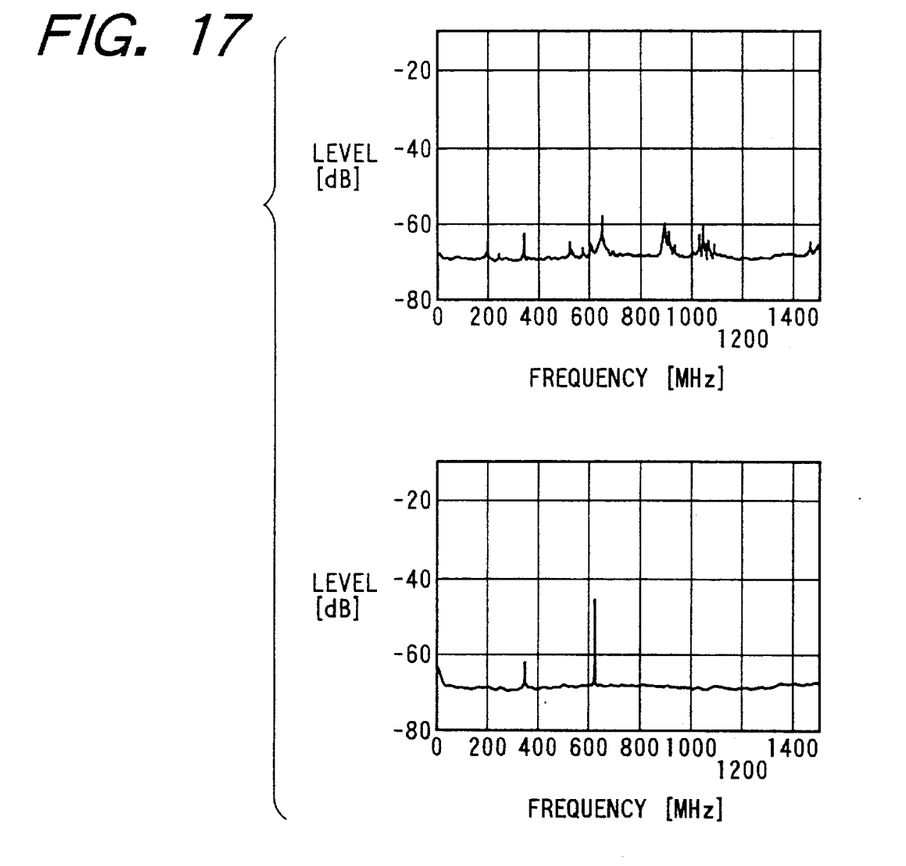
FIG. 17 illustrates examples of a partial discharge spectrum when a spacer cracks and separates.
Figure 18:
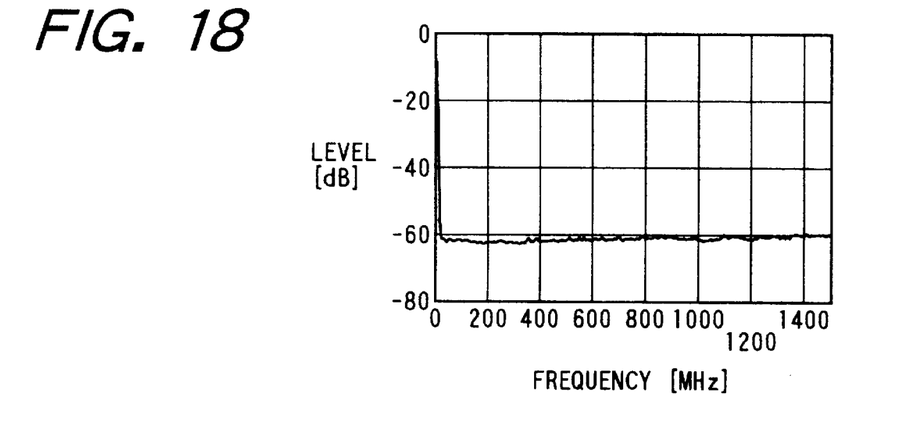
FIG. 18 is a diagram illustrating the noise level when electromagnetic waves in the device are measured.
Figure 19:
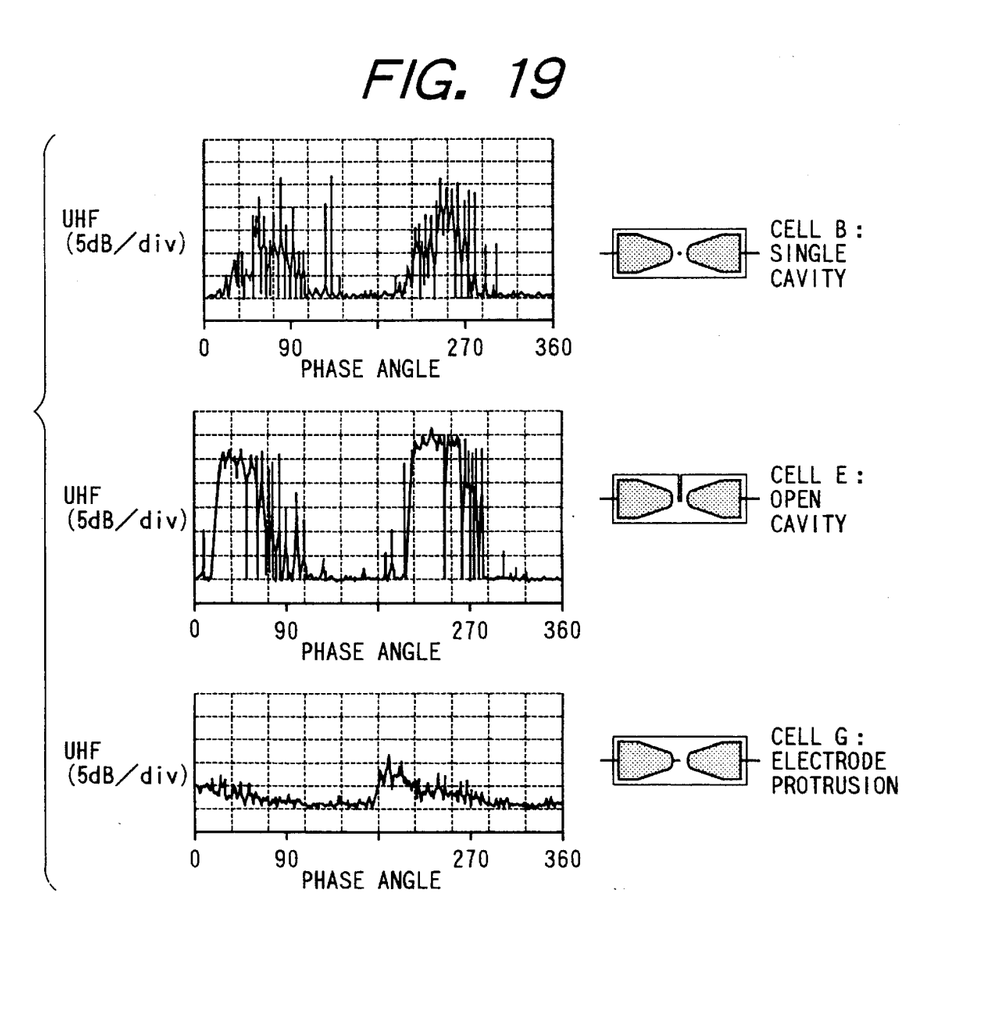
FIG. 19 illustrates the intensity distributions with respect to voltage phase angles and the kinds of defect.

The insulated device diagnosing system of the present embodiment makes the specific frequencies variable although it is constructed as in the embodiment shown in FIG. 14. As a result, the present embodiment is advantageous in that a plurality of more appropriate specific frequencies can be selected for various kinds of partial discharge. In the example of FIG. 16, the partial discharge can be detected by preparing the detection data given a periodic element for such one of the selected frequencies that the frequency has the largest difference between the detected intensity and the noise, and by displaying the detection data on a screen or by processing the same. By using this method, it is possible to reduce the number of detection data when the state of partial discharge is automatically monitored for a long time. As a result, the capacity of the memory unit can be reduced to prolong the maintenance interval and to hold down the cost.

By selecting a plurality of specific frequencies to prepare the detection data, according to the present invention, it is possible to highly precisely detect electromagnetic waves which are generated from partial discharge varying with the kind and location of the partial discharge and the circuitry of the power device, and to judge the state of the partial discharge highly precisely from the spectral pattern and the intensity between the individual frequencies.

What is claimed is:

1. A partial discharge detecting method comprising the steps of: inputting a partial discharge signal resulting from a partial discharge of an insulated device from an input terminal; determining an intensity in which said partial discharge signal is expanded for each frequency by an FFT or a spectral analyzer to select a plurality of different specific frequencies from frequencies having high intensities, detecting the intensity of each frequency of said partial discharge signal to select a plurality of specific frequencies, of which the intensities exceed a predetermined value, or selecting the frequency having the highest intensity from the specific frequencies; preparing detection data from the partial discharge signal which are given periodic elements at a specific frequency selected; and processing at least one of said detection data or displaying the detection data on a screen to detect the partial discharge.

2. A partial discharge detecting method according to claim 1, wherein an extent or kind of abnormality, deterioration, or lifetime of the insulated device is diagnosed by processing said detection data by a neuro computer method or by a finger printing method.

3. A partial discharge detecting method comprising the steps of: inputting a partial discharge signal of an insulated device from an input terminal; preparing detection data from the partial discharge signal such that a plurality of different specific frequencies of the partial discharge signal are given periodic elements; preparing sampling data by differentiating either averaged data averaged from detection data of different frequencies or known data from the individual detection data, or by differentiating the intensities of the detection data detected by antennas provided in different positions of the insulated device, between identical frequencies; and diagnosing an extent of abnormality, a deterioration or a lifetime of the device from the pattern or the intensities of the prepared sampling data.

4. An insulated device diagnosing system comprising: a plurality of antennas provided in an insulated device; a pattern generator for receiving partial discharge signals, resulting from a partial discharge in the insulated device, from said antennas, and preparing detection data from the partial discharge signals such that periodic elements are given to a plurality of different specific frequencies of the partial discharge signals; a neuro computer or a finger printing method operation unit for processing the detection data prepared by said pattern generator; and a judgment unit for diagnosing the extent of abnormality, a deterioration or a lifetime of said device from the operation result of said neuro computer or finger printing method operation unit;

wherein said insulated device is a gas insulated breaker;

wherein said partial discharge signals come from said plurality of antennas, which are provided at different positions in said gas insulated device, and said partial discharge signals are measured synchronously; and wherein the partial discharge is located from the spectral patterns or intensity ratios of said detection data between the same frequencies.

5. An insulated device diagnosing system comprising: a plurality of antennas provided in an insulated device; a pattern generator for receiving partial discharge signals, resulting from a partial discharge of the insulated device, from said antennas, and preparing detection data from the partial discharge signals such that periodic elements are given to a plurality of different specific frequencies of the partial discharge signals; a neuro computer or a finger printing method operation unit for processing the detection data prepared by said pattern generator; and a judgment unit for diagnosing the extent of abnormality, a deterioration or a lifetime of said device from the operation result of said neuro computer or finger printing method operation unit;

wherein a distribution of frequency components of the partial discharge signals is also measured for specifying the different specific frequencies to be detected; and wherein said insulated device is a gas insulated breaker;

wherein said partial discharge signals come from said plurality of antennas, which are provided at different positions in said gas insulated device, and said partial discharge signals are measured synchronously; and wherein the partial discharge is located from the spectral patterns or intensity ratios of said detection data between the same frequencies.

* * * * *